(12) United States Patent
Lai et al.

(10) Patent No.: US 10,319,675 B2
(45) Date of Patent: Jun. 11, 2019

(54) CAPACITOR EMBEDDED WITH NANOCRYSTALS

(71) Applicant: Taiwan Semiconductor Manufacturing Company, Ltd., Hsin-Chu (TW)

(72) Inventors: Cheng-Chieh Lai, Hsin-Chu (TW); Meng-Ting Yu, Hsin-Chu (TW); Yung-Hsien Wu, Hsin-Chu (TW); Kuang-Hsin Chen, Jung-Li (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/995,036

(22) Filed: Jan. 13, 2016

(65) Prior Publication Data
US 2017/0200673 A1     Jul. 13, 2017

(51) Int. Cl.
| | |
|---|---|
| *H01L 23/522* | (2006.01) |
| *H01L 21/02* | (2006.01) |
| *H01L 21/283* | (2006.01) |
| *H01L 21/324* | (2006.01) |
| *H01L 23/535* | (2006.01) |
| *H01L 27/06* | (2006.01) |
| *H01L 49/02* | (2006.01) |
| *H01L 27/108* | (2006.01) |

(52) U.S. Cl.
CPC .... *H01L 23/5223* (2013.01); *H01L 21/02532* (2013.01); *H01L 21/02601* (2013.01); *H01L 21/283* (2013.01); *H01L 21/324* (2013.01); *H01L 23/535* (2013.01); *H01L 27/0629* (2013.01); *H01L 27/10814* (2013.01); *H01L 28/40* (2013.01); *H01L 28/60* (2013.01)

(58) Field of Classification Search
None
See application file for complete search history.

(56) References Cited

U.S. PATENT DOCUMENTS

| | | | | |
|---|---|---|---|---|
| 5,587,870 A | * | 12/1996 | Anderson | H01G 4/20 257/E21.008 |
| 8,869,436 B2 | | 10/2014 | Tsai et al. | |
| 2008/0290401 A1 | * | 11/2008 | Yasui | G11C 16/0425 257/324 |
| 2008/0296650 A1 | | 12/2008 | Ahn et al. | |
| 2009/0001346 A1 | * | 1/2009 | Kim | B82Y 10/00 257/4 |
| 2009/0296491 A1 | * | 12/2009 | Hong | G11C 16/0425 365/185.29 |

(Continued)

FOREIGN PATENT DOCUMENTS

| | | |
|---|---|---|
| CN | 101174579 | 5/2008 |
| CN | 101194355 | 6/2008 |

(Continued)

*Primary Examiner* — Khaja Ahmad
(74) *Attorney, Agent, or Firm* — Haynes and Boone, LLP

(57) ABSTRACT

The present disclosure provides one embodiment of a semiconductor structure that includes an interconnection structure formed on a semiconductor substrate; and a capacitor disposed in the interconnection structure. The interconnection structure includes a top electrode; a bottom electrode; a dielectric material layer sandwiched between the top and bottom electrodes; and a nanocrystal layer embedded in the dielectric material layer.

20 Claims, 11 Drawing Sheets

(56) References Cited

U.S. PATENT DOCUMENTS

| | | |
|---|---|---|
| 2010/0068505 A1 | 3/2010 | Hartmut et al. |
| 2011/0233654 A1* | 9/2011 | Chih ................ H01L 29/42332 257/325 |
| 2012/0181657 A1* | 7/2012 | Wu ..................... H01L 23/5223 257/532 |
| 2013/0071988 A1* | 3/2013 | Deweerd ................ H01L 28/40 438/396 |
| 2013/0082382 A1* | 4/2013 | Torii ................ H01L 21/76898 257/737 |
| 2013/0234094 A1 | 9/2013 | Chang et al. |
| 2013/0336041 A1 | 12/2013 | Tsai et al. |
| 2014/0021584 A1* | 1/2014 | Tu .................... H01L 27/10894 257/532 |
| 2014/0050029 A1* | 2/2014 | Kang ................ G11C 16/0425 365/185.23 |
| 2014/0146593 A1 | 5/2014 | Tsai et al. |
| 2014/0166961 A1 | 6/2014 | Liao et al. |
| 2014/0170833 A1* | 6/2014 | Rui ........................ H01L 28/60 438/396 |
| 2014/0175365 A1 | 6/2014 | Chang et al. |
| 2014/0187016 A1* | 7/2014 | Malhotra ................ H01L 29/92 438/381 |
| 2014/0203236 A1 | 7/2014 | Chen et al. |
| 2014/0264222 A1 | 9/2014 | Yang et al. |
| 2014/0264233 A1 | 9/2014 | Tu et al. |
| 2015/0294970 A1 | 10/2015 | Jakushokas et al. |
| 2015/0380477 A1 | 12/2015 | Huang et al. |
| 2017/0117282 A1* | 4/2017 | Mathur ............. H01L 27/10852 |

FOREIGN PATENT DOCUMENTS

| | | |
|---|---|---|
| CN | 101312215 | 11/2008 |
| CN | 101388397 | 3/2009 |
| CN | 101807547 | 8/2010 |
| CN | 102201453 | 9/2011 |
| CN | 102593096 | 7/2012 |
| CN | 103579174 | 2/2014 |
| EP | 1389799 | 2/2004 |
| EP | 1526566 A2 | 4/2005 |

* cited by examiner

CAPACITOR EMBEDDED WITH NANOCRYSTALS

BACKGROUND

A capacitor, as a passive device, is an important device in integrated circuit (IC) and is widely used for various purposes, such as in random access memory (RAM) nonvolatile memory devices, or RC circuit. When the IC moves to advanced technology nodes with less feature sizes, a capacitor is almost non-shrinkable and cannot be scaled down to small dimensions due to capacitor characteristics. A capacitor takes a significant circuit area penalty. Furthermore, the existing method making a capacitor introduces defects into the capacitor and causes undesired current leakage through the capacitor. Accordingly, it would be desirable to provide a capacitor structure integrated with other circuit devices and a method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
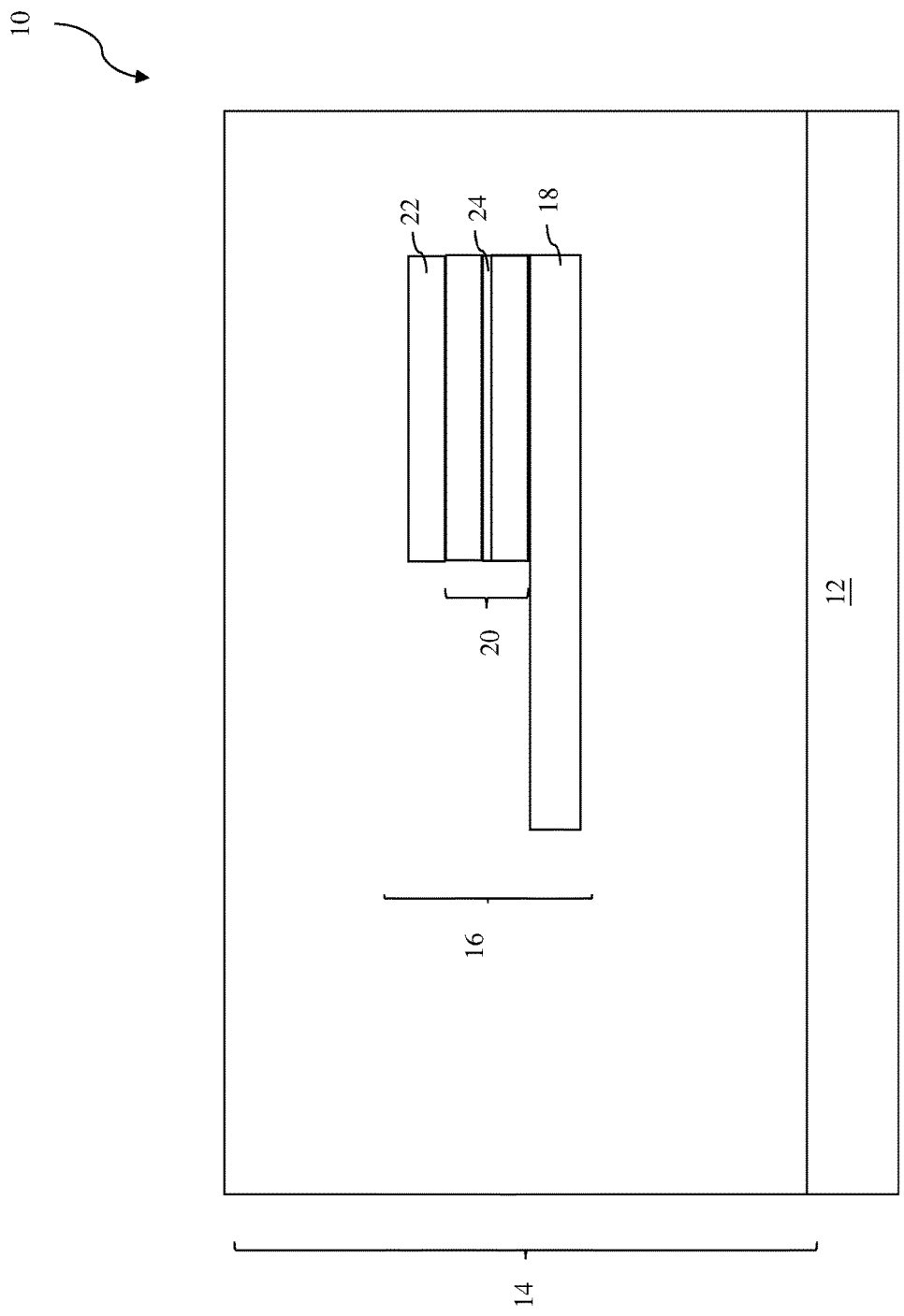
FIG. 1 is a sectional view of a semiconductor structure having a capacitor constructed according to aspects of the present disclosure in some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 illustrates a sectional view of a semiconductor structure 10 that includes a capacitor integrated with other devices on a substrate 12. In furtherance of the present embodiment, the substrate 12 is a silicon substrate. In some embodiments, the substrate 210 may include an elementary semiconductor, such as germanium in a crystalline structure; a compound semiconductor, such as silicon germanium, silicon carbide, gallium arsenic, gallium phosphide, indium phosphide, indium arsenide, and/or indium antimonide; or combinations thereof. In furtherance of the embodiments, those semiconductor material films may be epitaxially grown on the silicon substrate.

Various isolation features, such as shallow trench isolation (STI) features, may be formed on the substrate 12 and define various active regions in a planar or non-planar structure (such as fin active regions). In some examples, the STI features include one or more dielectric materials, such as silicon oxide, low-k dielectric material, air gap, other suitable dielectric materials, or a combination thereof. In some embodiments, the substrate 12 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods. The substrate 12 may include various doped features depending on design requirements as known in the art. The doped features may be doped with p-type dopants, such as boron; n-type dopants, such as phosphorus or arsenic; or combinations thereof. The doped features may be formed by ion implantations and are configured to form one or devices, such as field-effect transistors (FETs), diodes, memory devices or a combination thereof.

The semiconductor structure 10 further includes various devices or portions of the devices formed on the substrate 12. For example, in a FET, source and drain features are doped features formed in the substrate 12, a gate stack is formed on the substrate 12 and is disposed between the source and drain features.

The semiconductor structure 10 further includes a multilayer interconnection (MLI) structure 14 to couple various devices to form a functional circuit. The multilayer interconnection structure includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The semiconductor structure 10 also includes a capacitor 16 configured in the MLI structure 14. For example, the capacitor 16 is formed in a dielectric material layer between $n^{th}$ metal layer and $(n+1)^{th}$ metal layer, such as between $6^{th}$ metal layer and $7^{th}$ metal layer. The capacitor 16 is coupled with other devices through the MLI structure 14 to form a functional circuit. For example, the capacitor 16 is coupled with a field-effect transistor to form a memory device.

The capacitor 16 includes a bottom electrode 18, a dielectric layer 20 and a top electrode 22 in a configuration such that the dielectric layer 20 is disposed between the bottom electrode 18 and the top electrode 22. The bottom and top electrodes are conductive and are made of a conductive material, such as metal, metal alloy or other suitable conductive material. In some examples, the bottom electrode 18 is configured in the $n^{th}$ metal layer and is simultaneously formed with the $n^{th}$ metal layer. In some other examples, the top electrode 22 is configured in the $(n+1)^{th}$ metal layer and is simultaneously formed with the $(n+1)^{th}$ metal layer.

The dielectric layer 20 includes a dielectric material, such as a high dielectric constant material (high-k dielectric material). In one example, the high-k dielectric material includes titanium oxide. In some examples, the high-k dielectric material includes metal oxides, metal nitrides, metal silicates, transition metal-oxides, transition metal-nitrides, transition metal-silicates, oxynitrides of metals, metal aluminates, zirconium silicate, zirconium aluminate, HfO2, ZrO2, ZrOxNy, HfOxNy, HfSixOy, ZrSixOy, HfSixOyNz, ZrSixOyNz, Al2O3, TiO2, Ta2O5, La2O3, CeO2, Bi4Si2O12, WO3, Y2O3, LaAlO3, Ba1 xSrxTiO3, PbTiO3, BaTiO3, SrTiO3, PbZrO3, PST, PZN, PZT, PMN, other suitable high-k dielectric material or a combination thereof. In various examples, the method to form high-k dielectric material film includes Metal Organic Chemical Vapor Phase Deposition (MOCVD), PVD, atomic layer deposition (ALD), molecular beam epitaxy (MBE), other suitable technique, or a combination thereof. In another example, the high-k dielectric material may be formed by UV-Ozone Oxidation, which includes sputtering metal film; and oxidation by in-situ of metal film by O2 in presence of UV light. In other embodiments, the dielectric material layer may alternatively or additionally include low dielectric constant material (low-k dielectric material), other dielectric material, such as silicon oxide, silicon nitride, silicon oxynitride, or a combination thereof. In various examples, the dielectric material layer 20 may have multiple dielectric films. The dielectric material layer 20 is designed to have a dielectric constant, a thickness, a surface area (that contacts both the bottom and top electrodes, or in other words, being overlapped with the surfaces of both the top and bottom electrode s) according to the specification of the product, such as the designed capacitance of the capacitor 16.

Figure 2:
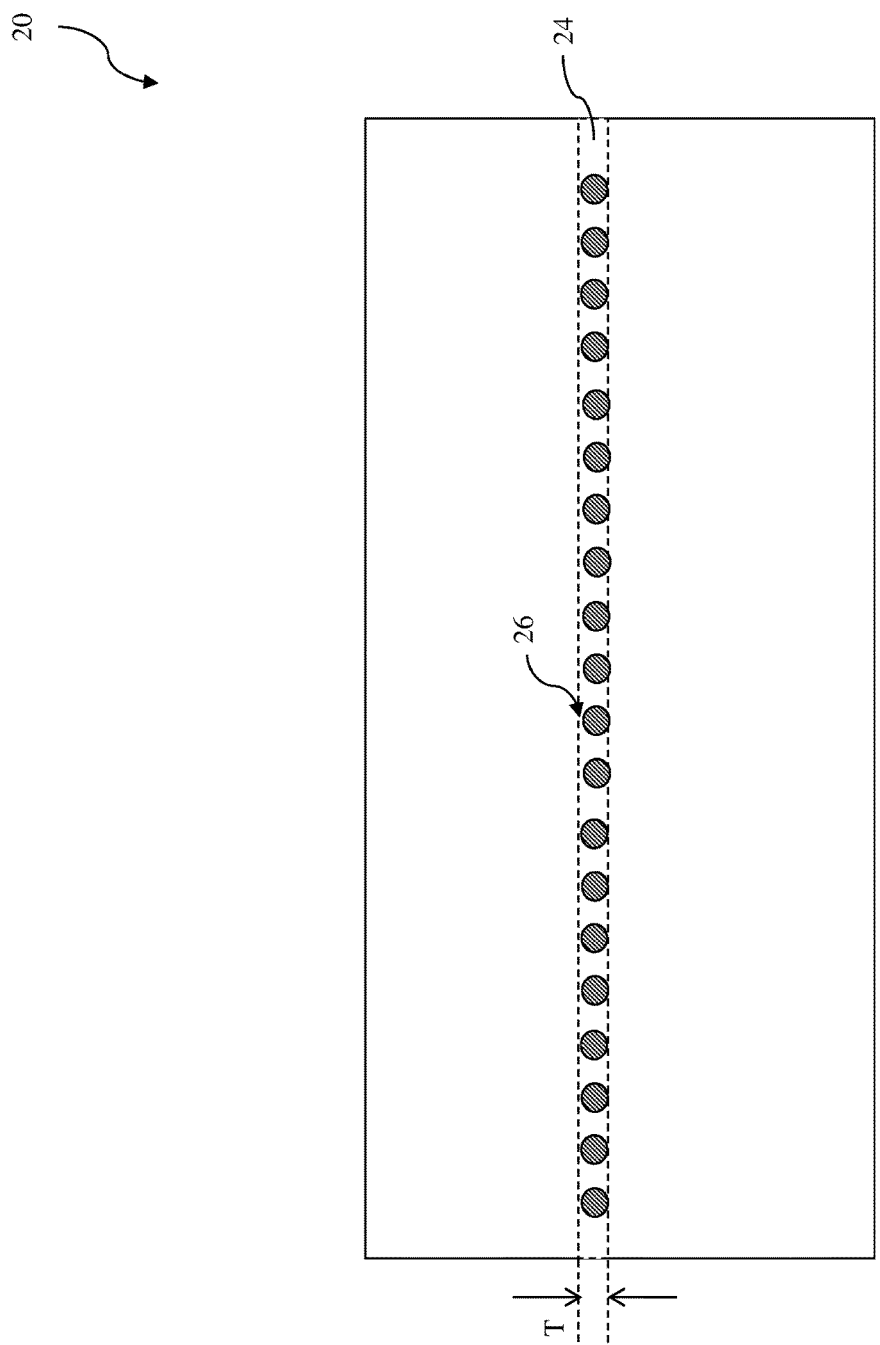
FIG. 2 is a sectional view of a dielectric layer of the capacitor in FIG. 1, constructed in accordance with some embodiments.

Particularly, the dielectric layer 20 further includes a nanocrystal layer 24 embedded in the dielectric material of the dielectric layer 20. The nanocrystal layer 24 includes a plurality of nanocrystal domains 26, as illustrated in FIG. 2. The nanocrystal domains 26 function as centers to trap charges in the dielectric material layer 20, thereby, eliminating the leakage current through the dielectric material layer 20. In the present embodiments, the nanocrystal domains 26 are polycrystalline grains of a material different from that of the dielectric material layer 20 in composition. For example, the nanocrystal domains 26 are polycrystalline grains of a semiconductor material.

In the present example, the nanocrystal layer 24 is a germanium nanocrystal layer, and the nanocrystal domains 26 are polycrystalline germanium grains randomly dispersed in the thin portion of the dielectric material layer 20, such as a thin layer of a thickness 'T'. The size and number density of the germanium polycrystal germanium grains are determined by a corresponding nanocrystal forming process to form the nanocrystal layer 24. The nanocrystal forming process is designed to have the nanocrystal layer with size and number density such that to effectively eliminate the leakage current of the capacitor 16.

The dielectric material layer 20 embedded with the nanocrystal layer 24 and a method 50 making the same are further described below, with reference to FIGS. 3-7.

Figure 3:
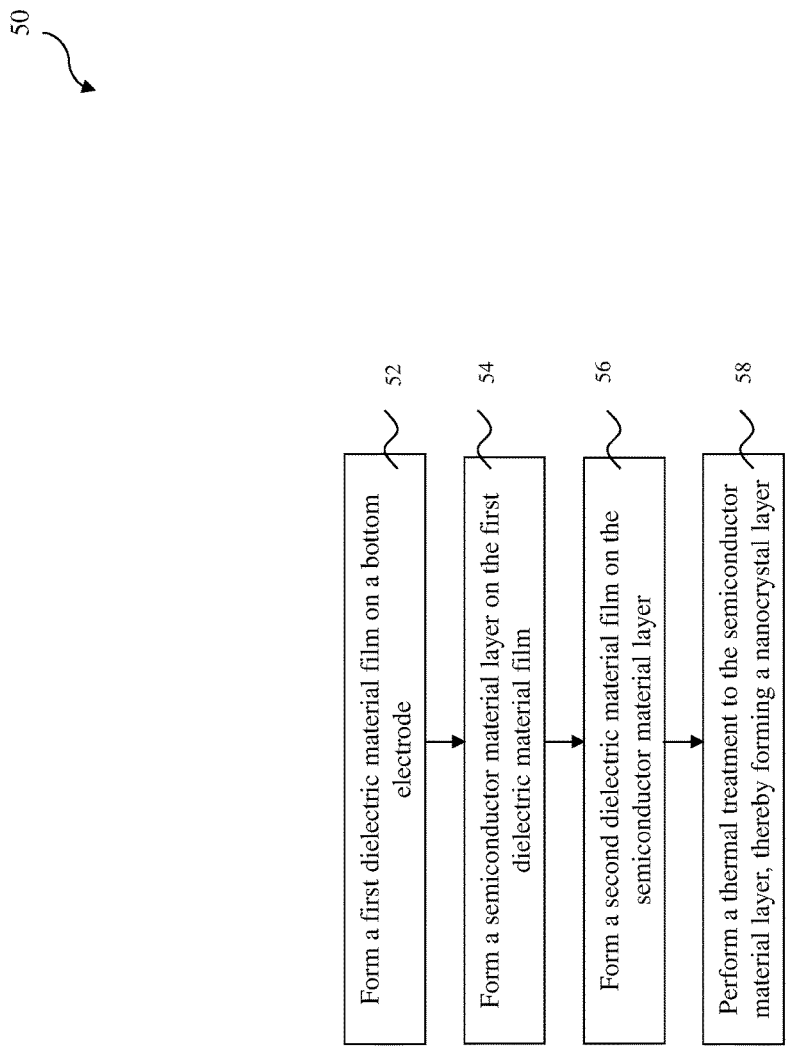
FIG. 3 is a flowchart of a method making the semiconductor structure having a capacitor constructed according to aspects of the present disclosure in some embodiments.
Figure 4:
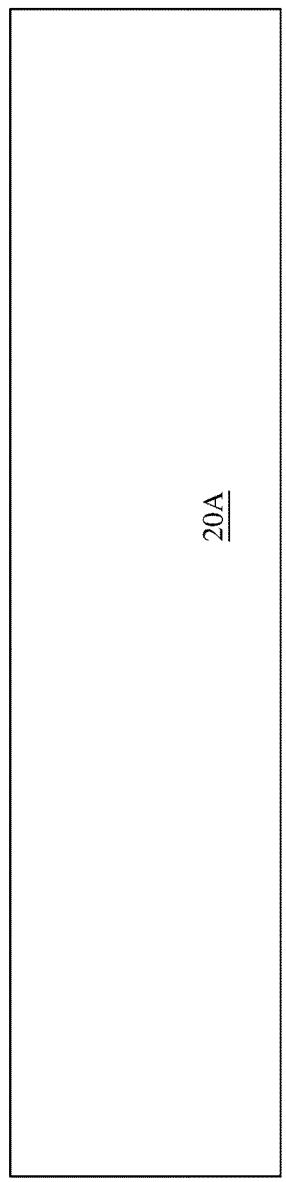
FIGS. 4, 5, 6, and 7 are sectional views of a semiconductor structure at various fabrication stages constructed in accordance with some embodiments.

Referring to FIGS. 3 and 4, the method 50 begins at an operation 52 to form a first dielectric material film 20A on the bottom electrode 18. The formation and composition of the first dielectric material film 20A are described above. For examples, the first dielectric film 20A may include a high-k dielectric material (such as titanium oxide), other suitable dielectric material or a combination thereof; and may be deposited by MOCVD, PVD, ALD, MBE or other suitable deposition technique. The first dielectric material film 20A may have a thickness ranging between 1 nm and 30 nm, according to some embodiments.

Figure 5:
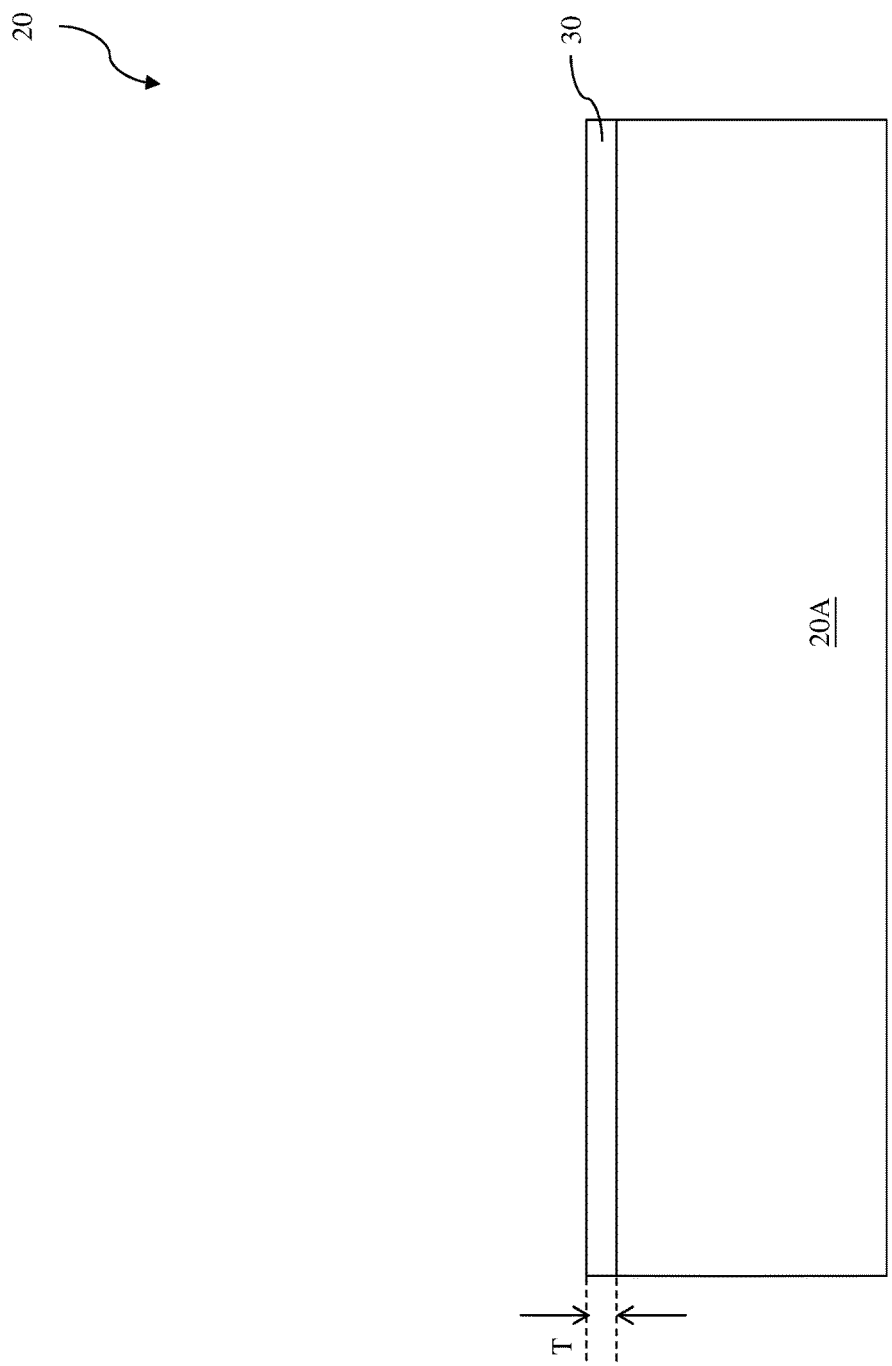

Referring to FIGS. 3 and 5, the method 50 proceeds to an operation 54 to form a semiconductor material layer 30 on the first dielectric material film 20A. The semiconductor layer 30 may be formed by a suitable deposition method, such as CVD, ALD or other suitable deposition technique. The semiconductor layer 30 has a thickness ranging from 0.5 nm to 10 nm. In other examples, the semiconductor layer 30 has a thickness ranging from 0.8 nm to 5 nm. In the present embodiments, the semiconductor layer 30 is a germanium layer. In furtherance of the embodiments, the precursor to form the germanium layer includes germane (GeH4). Additionally, a non-reactive carry gas, such as nitrogen gas, may be further provided during the deposition. Alternatively, the precursor may include $Ge_2H_6$, $Ge_3H_8$, $GeH_4$, or a combination thereof. In various examples, the deposition may be plasma-enhanced CVD or atmospheric pressure CVD.

Figure 6:
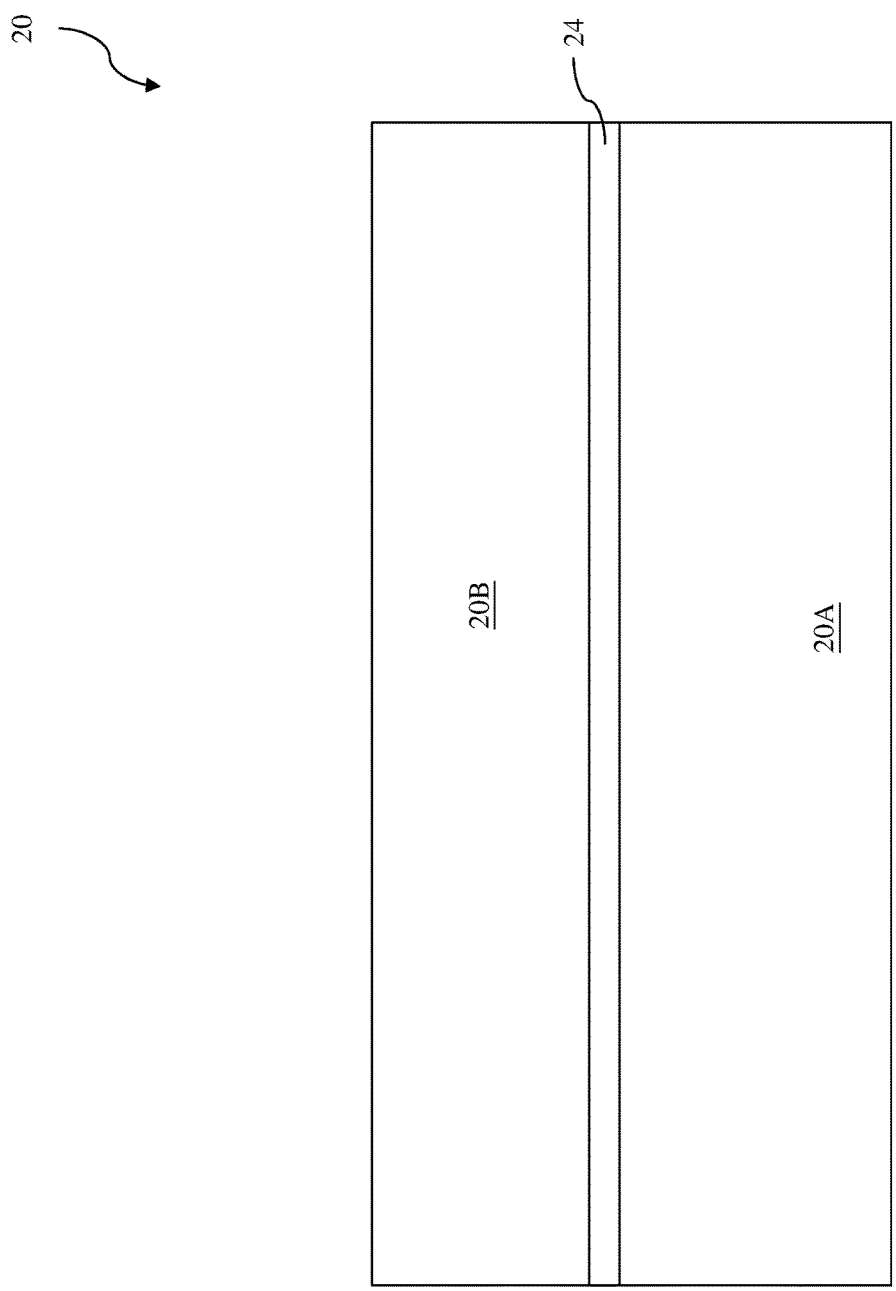

Referring to FIGS. 3 and 6, the method 50 begins at an operation 56 to form a second dielectric material film 20B on the semiconductor layer 30. The formation and composition of the second dielectric material film 20B are similar to that of the first dielectric material film 20A in terms of composition and formation. For examples, the second dielectric material film 20B may include a high-k dielectric material (such as titanium oxide), other suitable dielectric material or a combination thereof; and may be deposited by MOCVD, PVD, ALD, MBE or other suitable deposition technique. The second dielectric material film 20B may have a thickness ranging between 1 nm and 30 nm, according to some embodiments. In other embodiments, the second dielectric material film 20B may include a dielectric material different from that of the first dielectric material film in composition. For examples, the first dielectric material film 20A includes titanium oxide and the second dielectric material film 20B includes hafnium oxide.

Figure 7:
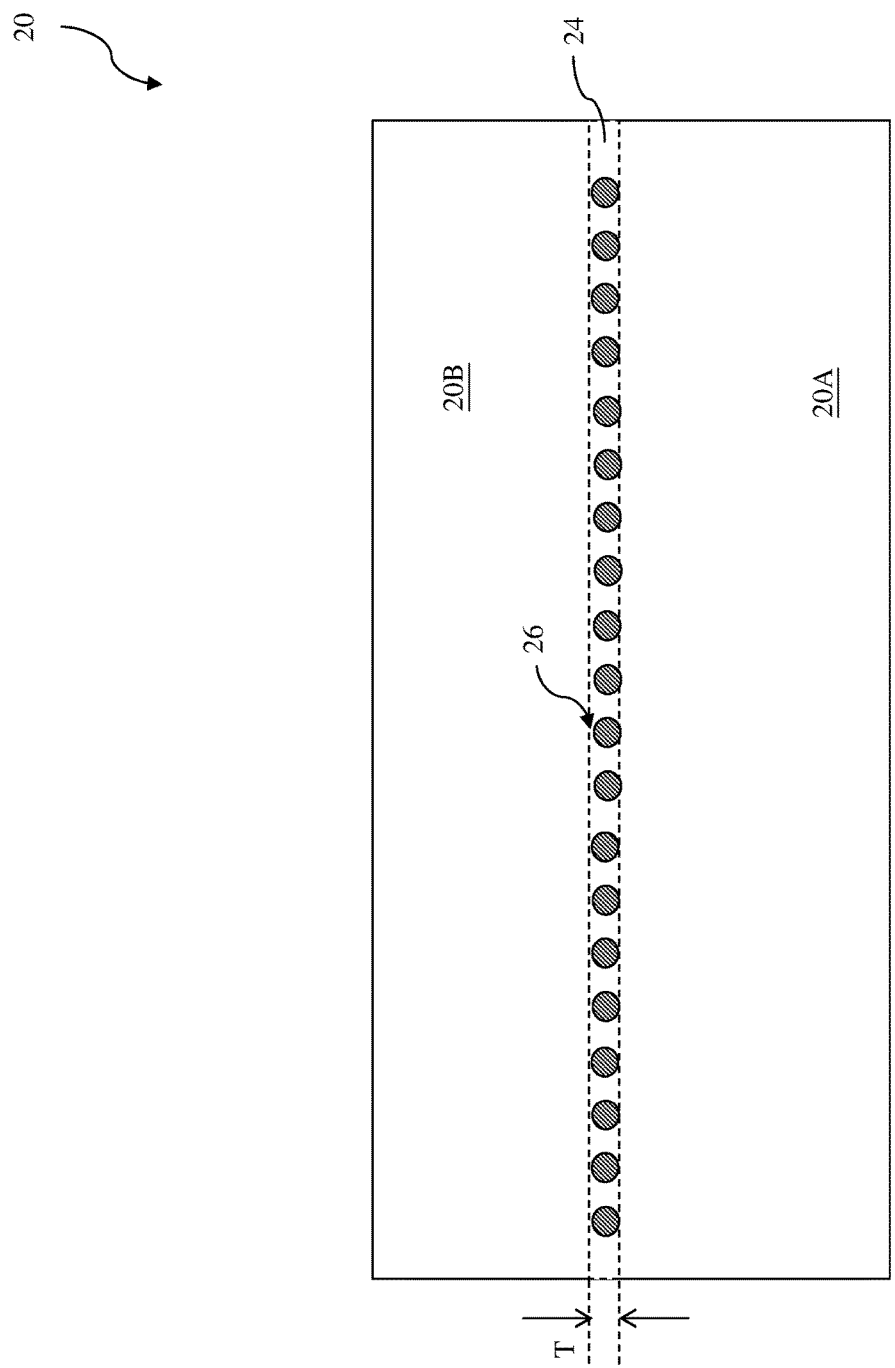

Referring to FIGS. 3 and 7, the method 50 proceeds to an operation 58 to apply a treatment to the semiconductor layer 30, thereby forming the nanocrystal layer 24 having the plurality of nanocrystal domains 26. In the present embodiment, the operation 58 for the treatment is implemented after the operation 56 for the second dielectric material film 20B; and the treatment includes a thermal treatment, such as rapid thermal annealing (RTA). The thermal treatment in the operation 58 converts the deposited semiconductor layer 30 into the nanocrystal layer 24. The thermal profile (particularly, the peak temperature and anneal duration) of the thermal treatment in the operation 58 determines the grain sizes, and number density of the polycrystalline grains 26. Those parameters are related to the efficiency of the nanocrystal layer 24 for trapping the charges and blocking the current through the dielectric layer 20. The experiments identified that the efficiency of the nanocrystal layer 24 is increased when the number density is increase and the grain sizes are decreased. Further experiments also identified that the grain sizes are decreased when the annealing duration is increased. In the present examples, the thermal treatment includes an annealing temperature ranging 300° C. and 700° C. The annealing temperature defines the peak temperature in the thermal profile of the thermal treatment. The annealing duration is optimized in consideration of the grain sizes and the thermal budget in the fabrication. In some examples, the annealing duration ranges between 10 minutes and 20 minutes. In some embodiments, the operation 58 further includes nitrogen plasma during the thermal annealing. For examples, the nitrogen plasma is supplied to the semiconductor structure 10 through the thermal treatment. In other examples, the nitrogen plasma may be applied to the semiconductor structure 10 after the thermal treatment. In yet other examples, hydrogen plasma may be additionally applied to the semiconductor structure 10 during the operation 58. In some other examples, the thermal annealing process is applied to the semiconductor structure 10 under an atmospheric pressure. Thus formed polycrystalline grains 26 are dispersed in the dielectric layer 20 and are distributed in the thin layer 24 with a thickness T. In various embodiments, the grain sizes of the nanocrystals ranges between 5 angstrom and 40 angstrom Referring back to FIG. 1, the semiconductor structure 10 may include other features, such as a redistribution layer, bonding pads, and a passivation layer. In one example, one or more transistors are formed on the substrate 12 and are coupled with the capacitor 16 to form a functional circuit, such as a memory device.

Figure 8:
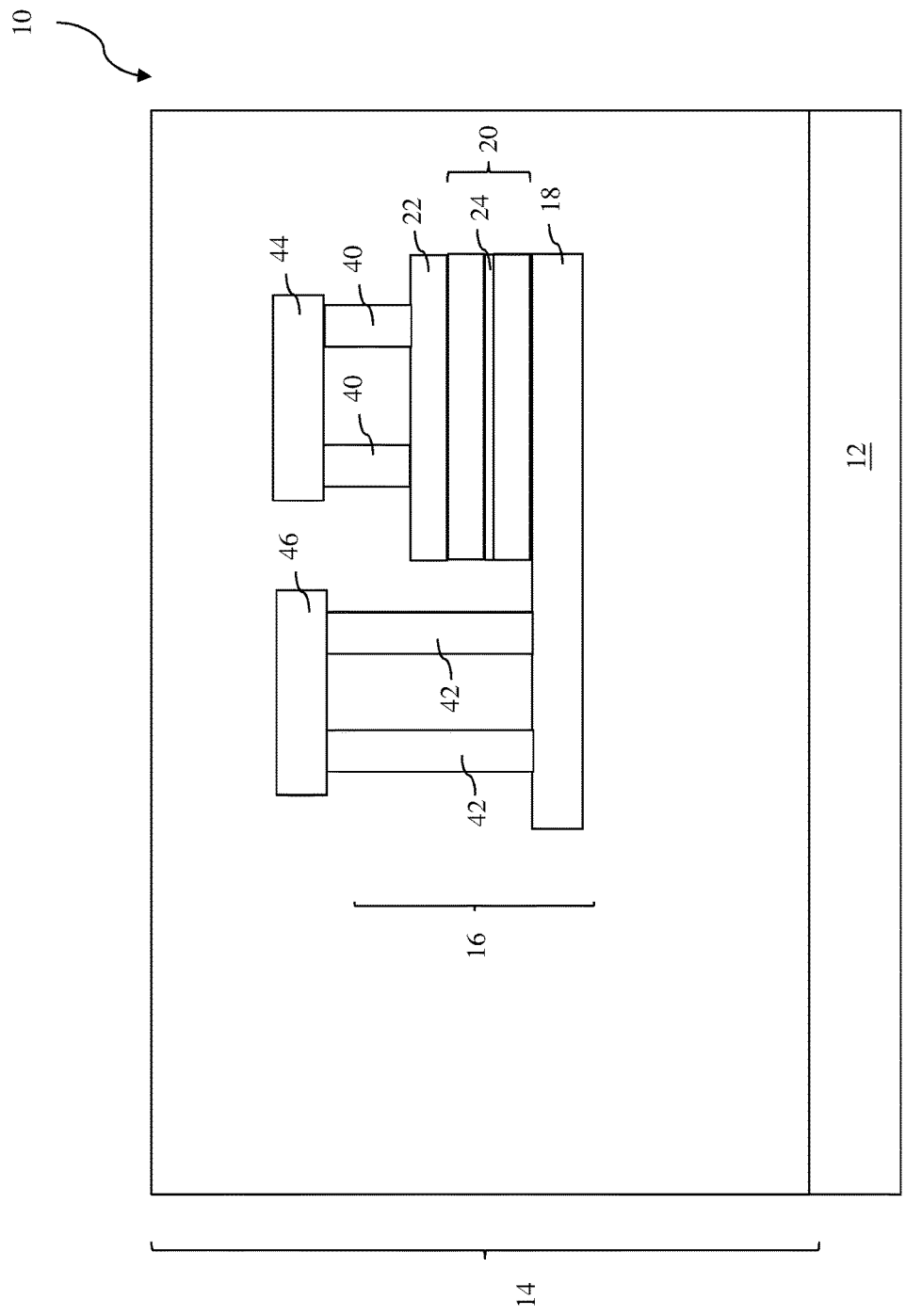
FIG. 8 is a sectional view of a semiconductor structure having a capacitor constructed in accordance with some embodiments.

In the present embodiments, the semiconductor structure 10 further includes contacts configured to electrically coupled with the bottom electrode 18 and the top electrode 22, respectively, as illustrated in FIG. 8. The semiconductor structure 10 includes one or more first contact feature 40 landing on the top electrode 22 and electrically connected to the top electrode 22. The semiconductor structure 10 also includes one or more second contact feature 42 landing on the bottom electrode 18 and electrically connected to the bottom electrode 18. In this case, the bottom electrode 18 is horizontally extended beyond an edge of the top electrode 22 such that the offset portion provides a base for the second contact feature 42 to land on. In furtherance of the embodiments, metal lines 44 and 46 are disposed in a configuration such that first metal line 44 and the second metal line 46 electrically connect to the first contact feature 40 and the second contact feature 42, respectively. In some embodiments, the bottom electrode 18 is portion of the $n^{th}$ metal layer; and the metal lines 44 and 46 are portions of the $(n+1)^{th}$ metal layer.

Figure 9:
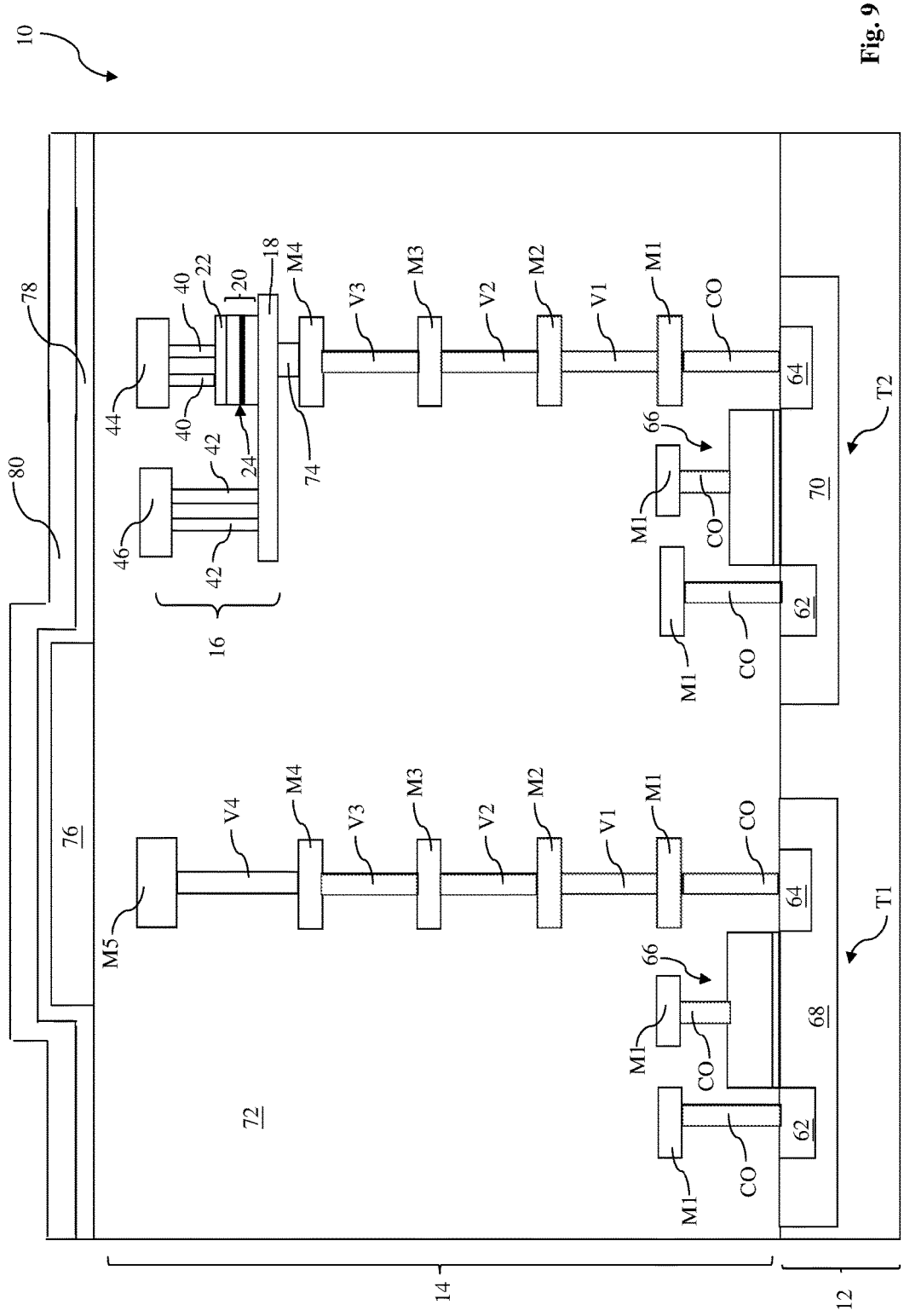
FIG. 9 is a sectional view of a semiconductor structure having a capacitor constructed in accordance with some embodiments.

FIG. 9 illustrates a sectional view of the semiconductor structure 10, constructed in accordance with some embodiments. The semiconductor structure 10 includes a substrate 12 and various devices, such as transistors T1 and T2, formed on the substrate 12. Each transistor (T1 or T2) includes a source 62 and drain 64 formed in the substrate 12, and further includes a gate stack 66 formed on the substrate 12 and interposed between the source 62 and the drain 64. Each transistor may be formed in a doped well. For examples, the first transistor T1 is formed on a first doped well 68 and the second transistor T2 is formed on a second doped well 70. In some embodiments, the first doped well 68 is a doped well of a first-type conductivity and the second doped well 70 is a doped well of a second-type conductivity opposite to the first-type conductivity or alternatively same to the first-type conductivity. For examples, the first doped well 68 is a p-type doped well and the first transistor T1 is an n-type FET while the second doped well 70 is an n-type doped well and the second transistor T2 is a p-type FET.

The semiconductor structure 10 also includes an interconnection structure 14 formed on the substrate 12. The interconnect structure 14 further includes various conductive features configured to provide electrical routing and to couple various devices to form a functional circuit. The interconnect structure 14 includes two or more metal layers each having a plurality of metal lines. The interconnect structure 14 further includes contacts to connect devices (such as sources, drains and gates of transistors) to the metal lines; and vias to vertically connects metal lines in the different metal layers. In various embodiments, the conductive features include copper, aluminum, tungsten, metal alloy or other suitable conductive material. Those conductive features (contacts, vias and metal lines) are embedded in an interlayer dielectric (ILD) material layer 72. In various embodiments, the ILD material layer 72 includes silicon oxide, low k dielectric material, other suitable dielectric material, or a combination thereof. The dielectric material layer may be deposited by CVD, spin-on coating, or other suitable technique. In various examples, the formation of the interconnection structure 14 includes a suitable procedure, such as damascene process. As only an example for illustration, the interconnection structure five metal layers, metal-1 (labeled as M1); metal-2 (labeled as M2); . . . ; and metal-5 (labeled as M5). Contacts (labeled as CO) are configured vertically between the metal lines in the metal-1 (M1) and the substrate (and/or gate). Vias are configured vertically between the adjacent metal layers and referred to as via-1 (labeled as V1); via-2 (labeled as V2; . . . ; and via-4 (labeled as V4).

Figure 10:
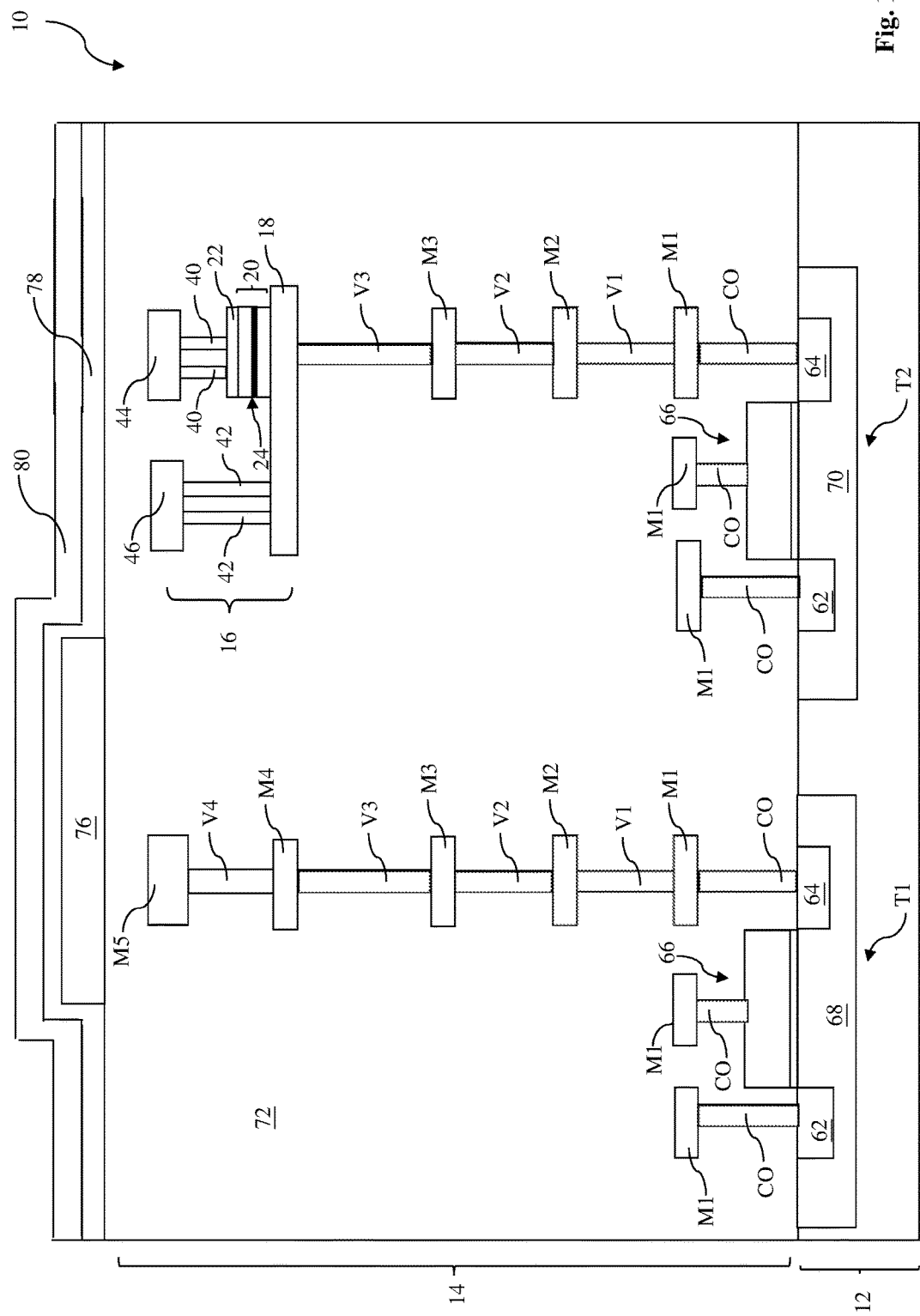
FIG. 10 is a sectional view of a semiconductor structure having a capacitor constructed in accordance with some embodiments.

In the semiconductor structure 10, the capacitor 16 is disposed between two adjacent metal layers of the interconnection layer 14, such as between the metal-x ($M_x$) layer and the metal-(x+1) ($M_{x+1}$) layer. In the present embodiment, two adjacent metal layers are the metal-4 (M4) layer and the metal-5 (M5) layer. Especially, the conductive features 44 and 46 are metal lines of the metal-5 layer. In some examples, the bottom electrode 18 is above the metal-4 (M4) layer and is further connected to a metal line in the metal-4 (M4) layer, such as through a conductive feature 74. Alternatively, the bottom electrode 18 may be a metal line in the metal-4 (M4), as illustrated in FIG. 10.

The capacitor 16 is an element of a circuit in the semiconductor structure 10 and therefor is integrated with other components of the circuit. In one example for illustration, the capacitor 16 is coupled to a transistor T2. In some other examples, the transistor T1 has source 62, drain 64 and gate 66 connected to metal lines in the metal-1 (M1) through contacts (CO), respectively; the first metal layer 20 includes a first metal feature 20A disposed in the first region 14 and a second metal feature 20B disposed in the second region 14. The second metal layer 22 includes a third metal feature 22A disposed in the first region 14 and a fourth metal feature 22B disposed in the second region 14.

In some examples, the semiconductor structure 10 may further include some other features, such as a redistribution layer 76 (that may be formed in an additional metal layer), bonding pads 78, and a passivation layer 80.

Figure 11:
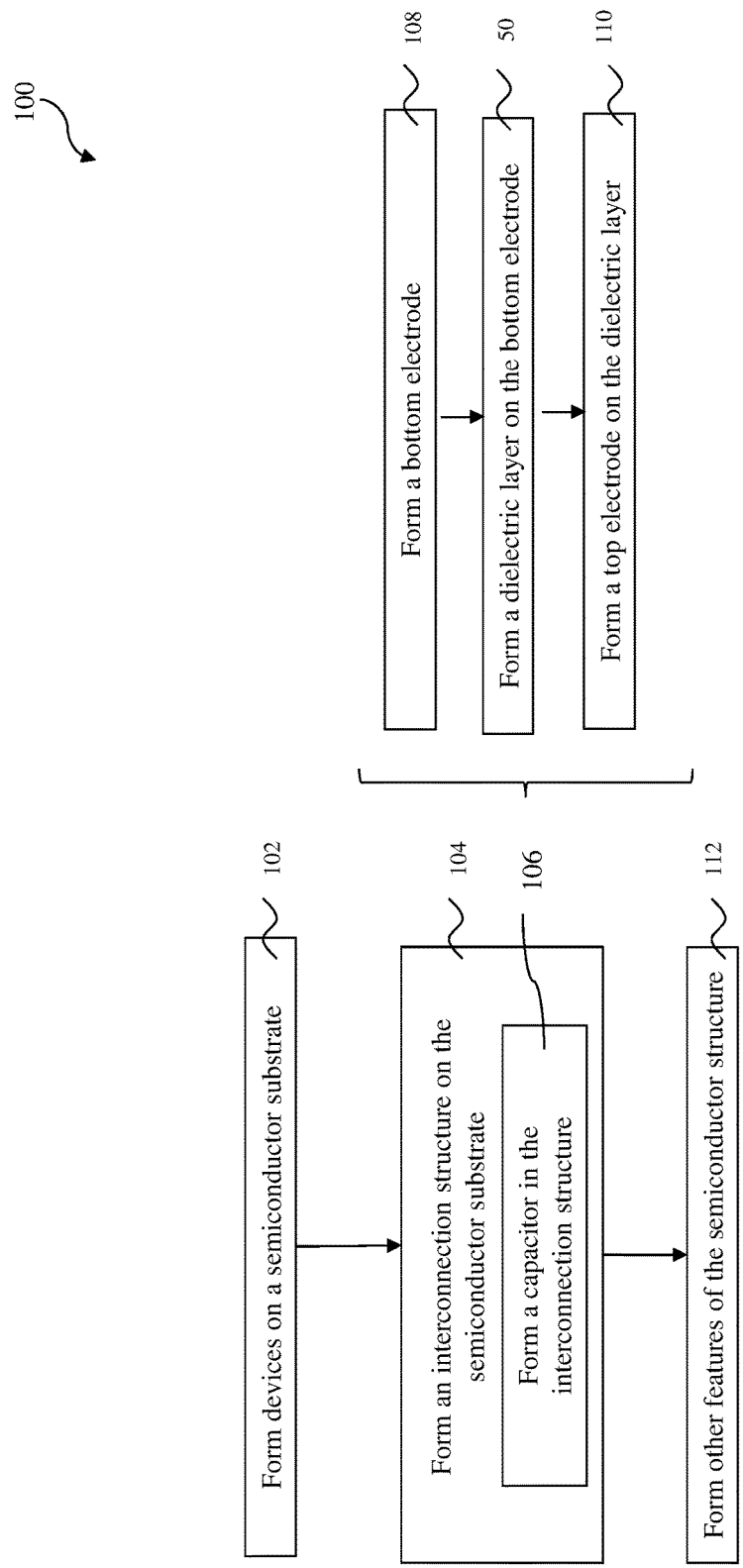
FIG. 11 is a flowchart of a method making the semiconductor structure having a capacitor constructed according to aspects of the present disclosure in one or more embodiment

FIG. 11 is a flowchart of a method 100 for fabricating the semiconductor structure 10, in accordance with some embodiments. The method 100 includes an operation 102 to form transistors and various other devices, such as diodes on the substrate 12. The operation 102 further includes forming isolation features, such as STI features 218, in the substrate 102, thereby defining active regions. In some embodiments, the active regions may be three dimensional active regions, such as fin-like active regions (also referred to as fin active regions). In one example, the fin active regions are formed by a procedure that includes forming trenches in the substrate; filling the trenches with one or more dielectric material; and polishing (such as chemical mechanical polishing or CMP); and recessing the STI features to form fin active regions extended above the STI features. In another example, the fin active regions are formed by a procedure that includes forming trenches in the substrate; filling the trenches with one or more dielectric material; and polishing (such as chemical mechanical polishing or CMP); and selectively epitaxially growing the active regions with a semiconductor material (same to or different from that of the substrate) to form fin active regions extended above the STI features.

The method 100 also includes an operation 104 to form the interconnection structure 14. The formation of the interconnection structure 14 includes multiple steps to form a plurality of metal layers with respective metal lines and contacts/vias. In some embodiments, metal lines include copper and each metal layer is formed by a damascene process, such as dual damascene process or single damascene process. In furtherance of the embodiments, a damascene process includes dielectric deposition, dielectric etching, metal deposition and CMP. In some embodiments, the metal lines include aluminum and each metal layer is formed by metal deposition, metal etch, dielectric deposition and dielectric etching. In some embodiments, contacts include tungsten and the contacts are formed by a process that includes dielectric deposition, etching to form contacts holes, tungsten deposition and CMP.

During the formation of the interconnection structure 14 in the operation 104, the method 100 also includes an operation 106 to form one or more capacitor, such as the capacitor 16 illustrated in FIG. 1. As noted above, the capacitor 16 is disposed in the interconnection structure 14, particularly between two adjacent metal layers, such as between metal-4 and metal-5 or between metal-6 and metal-7. Therefore, the formation of the capacitor 16 is between the formations of the corresponding two adjacent metal layers.

The operation 106 further includes an operation 108 to form a bottom electrode 18; an operation 50 to form the dielectric layer 20; and an operation 110 to form the top electrode 22. The operation 50 is described in FIG. 3 in accordance with some embodiments. Particularly, the operation 50 describes a procedure with various steps to form the dielectric layer 20 of the capacitor 16. The dielectric layer 20 includes a nanocrystal layer embedded therein to eliminate the leaking current through the dielectric layer. In one example, the bottom electrode may be formed with the lower metal layer or the top electrode may be formed with the upper metal layer. In another example, the contacts to the top and bottom electrodes may be formed with the formation of vias between the adjacent metal layers. In some embodiments, the semiconductor structure 10 further includes vertical conductive features, such as 40 and 42 in FIG. 8. The vertical conductive features 40 and 42 may be formed with the formation of vias between the adjacent metal layers in some examples.

The method 100 also includes an operation 112 to form other features of the semiconductor structure 10. For examples, the operation 112 includes form a redistribution layer, bonding pads and a passivation layer.

Various suitable techniques may be used to form respective features in the semiconductor structure 10. For example, the gates 66 include the gate dielectric layer and the gate electrode layer. In one embodiment, the gate dielectric layer includes silicon oxide, high k dielectric material or other suitable dielectric material. The gate electrode layer includes metal, polycrystalline silicon (polysilicon) or other suitable conductive material. In one embodiment, the gate material layers include high k dielectric material and metal, therefore, referred to as high k metal gate. In one embodiment, the gate dielectric layer includes an interfacial layer (such as silicon oxide) and a high k dielectric material layer, such as hafnium oxide (HfO) or other suitable metal oxide. The gate electrode layer includes a metal (or metal alloy) layer and may further include a polysilicon layer on the metal layer.

The present disclosure provides a semiconductor structure and a method making the same. The semiconductor structure includes a capacitor formed in the interconnection structure. The capacitor includes a dielectric material layer with embedded nanocrystals to effectively trap the carriers in the dielectric material layer and eliminate the leakage.

The embodiments of the present disclosure offer advantages over existing art, though it is understood that other embodiments may offer different advantages, not all advantages are necessarily discussed herein, and that no particular advantage is required for all embodiments. Various advantages may present in some embodiments. By utilizing the disclosed semiconductor structure, the capacitor includes a nanocrystal layer embedded in the dielectric layer. The capacitor is formed in the interconnect structure without occupying silicon area and without leakage issue.

The present disclosure is described above in various embodiments. Other features, process steps and alternatives may present. For example, the integrated circuit of the semiconductor structure 10 includes various circuit modules, such as random access memory (RAM) cell array, input/output (I/O), logic circuit module, control circuit block, analog circuit, reservoir capacitor and charge pump. In one example, the capacitor is used as a part of RC compensation network for analog circuit. In other examples, the capacitor is used in the reservoir capacitor and/or charge pump. In the disclosed structure according to one or more embodiment, the capacitor is formed in the interconnect structure at backend without cost of silicon area. The corresponding modules, such as reservoir capacitor and charge pump occupy much less silicon area with fewer footprints.

Thus, the present disclosure provides a semiconductor structure in accordance with some embodiments. The semiconductor structure includes an interconnection structure formed on a semiconductor substrate; and a capacitor disposed in the interconnection structure. The interconnection structure includes a top electrode; a bottom electrode; a dielectric material layer sandwiched between the top and bottom electrodes; and a nanocrystal layer embedded in the dielectric material layer.

The present disclosure also provides a semiconductor structure in accordance with some embodiments. The semiconductor structure includes a semiconductor substrate; an interconnect structure having a first metal layer on the semiconductor substrate and a second metal layer on the first metal layer and being adjacent to the first metal layer; and a capacitor disposed between the first and second metal layers, wherein the capacitor includes a dielectric material layer and a plurality of semiconductor polycrystalline grains dispersed in the dielectric material layer.

The present disclosure provides a method for making an integrated circuit having a capacitor, in accordance with some embodiments. The method includes forming a bottom electrode on a substrate; forming a first dielectric film on the bottom electrode; forming a semiconductor film on the first dielectric film; forming a second dielectric film on the semiconductor film; performing a thermal process to the semiconductor film, thereby forming a nanocrystal layer between the first and second dielectric films; and forming a top electrode on the second dielectric film.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
an interconnection structure formed on a semiconductor substrate; and
a capacitor disposed in the interconnection structure, wherein the capacitor includes:
a top electrode;
a bottom electrode;
a dielectric material layer sandwiched between the top and bottom electrodes; and
a nanocrystal layer with a first thickness embedded in the dielectric material layer, wherein the dielectric material layer includes a dielectric material extending continuously from the bottom electrode to the top electrode, wherein the nanocrystal layer is embedded in the dielectric material such that a first portion of the dielectric material with a second thickness that does not include nanocrystals is disposed between a bottom surface of the nanocrystal layer and a top surface of the bottom electrode facing away from the semiconductor substrate thereby preventing any portion of the nanocrystal layer from physically contacting the bottom electrode and a second portion of the dielectric material with a third thickness that does not include nanocrystals is disposed between a top surface of the nanocrystal layer facing away from the semiconductor substrate and a bottom surface of the top electrode thereby preventing any portion of the nanocrystal layer from physically contacting the top electrode, wherein the first thickness is smaller than the second and third thicknesses, wherein the first, second, and third thicknesses are uniform thicknesses and are measured parallel to a stacking direction of the semiconductor substrate, the top electrode, the bottom electrode, and the dielectric material layer.

2. The semiconductor structure of claim 1, wherein the nanocrystal layer includes a semiconductor material.

3. The semiconductor structure of claim 2, wherein the semiconductor material includes germanium.

4. The semiconductor structure of claim 1, wherein the nanocrystal layer includes a plurality of polycrystalline grains.

5. The semiconductor structure of claim 4, wherein the polycrystalline grains are germanium polycrystalline grains.

6. The semiconductor structure of claim 4, wherein the grain sizes range between 5 angstrom and 40 angstrom.

7. The semiconductor structure of claim 1, wherein the dielectric material is a high-k dielectric material.

8. The semiconductor structure of claim 1, wherein the dielectric material is titanium oxide.

9. The semiconductor structure of claim 1, further comprising
a lower metal layer formed on the semiconductor substrate;
an upper metal layer disposed on the lower metal layer, the upper metal layer having a first metal line in a first region and a second metal line in a second region;
a first conductive feature vertically connecting the first metal line to the top electrode of the capacitor; and
a second conductive feature vertically connecting the second metal line to the bottom electrode of the capacitor.

10. The semiconductor structure of claim 9, wherein
the bottom electrode of the capacitor is a metal line in the lower metal layer;
the bottom electrode extends from the first region to the second region; and
the capacitor is configured within the first region.

11. A semiconductor structure, comprising:
a semiconductor substrate;
an interconnect structure having a first metal layer on the semiconductor substrate and a second metal layer on the first metal layer and being adjacent to the first metal layer; and
a capacitor sandwiched between the first and second metal layers such that the capacitor physically contacts the first and second metal layers, wherein the capacitor includes:
a dielectric material layer;
a bottom electrode;
a top electrode; and
a layer of a plurality of semiconductor polycrystalline grains dispersed in a first portion of the dielectric material layer with a first thickness, wherein the dielectric material layer includes a dielectric material extending continuously from the bottom electrode to the top electrode, wherein the plurality of semiconductor polycrystalline grains are dispersed in the dielectric material such that a second portion of the dielectric material with a second thickness is disposed between the layer of the plurality of semiconductor polycrystalline grains and the bottom electrode thereby preventing any portion of the layer of the plurality of semiconductor polycrystalline grains from physically contacting the bottom electrode and a third portion of the dielectric material is disposed between the layer of the plurality of semiconductor polycrystalline grains and the top electrode thereby preventing any portion of the layer of the plurality of semiconductor polycrystalline grains from physically contacting the top electrode, wherein the first thickness is smaller than the second thickness, wherein the first and second thicknesses are uniform thicknesses and are measured parallel to a stacking direction of the semiconductor substrate, the top electrode, the bottom electrode, and the dielectric material layer.

12. The semiconductor structure of claim 11, wherein the semiconductor polycrystalline grains are germanium polycrystalline grains.

13. The semiconductor structure of claim 11, further comprising a field effect transistor (FET) formed on the semiconductor substrate and electrically connected to the bottom electrode of the capacitor.

14. A semiconductor capacitor, comprising:
a bottom electrode on a semiconductor substrate;
a top electrode over the bottom electrode;
a titanium oxide layer extending continuously from the bottom electrode to the top electrode; and
a nanocrystal layer with a first thickness that includes a semiconductor material embedded within the titanium oxide layer, wherein a first portion of the titanium oxide layer with a second thickness that does not include nanocrystals is disposed between a bottom surface of the nanocrystal layer and a top surface of the bottom electrode facing away from the semiconductor substrate thereby preventing any portion of the nanocrystal layer from physically contacting the bottom electrode and a second portion of the titanium oxide layer that does not include nanocrystals is disposed between a top surface of the nanocrystal layer facing away from the semiconductor substrate and a bottom surface of the top electrode thereby preventing any portion of the nanocrystal layer from physically contacting the top electrode, wherein the first thickness is smaller than the second thickness, wherein the first and second thicknesses are uniform thicknesses and are measured parallel to a stacking direction of the semiconductor substrate, the top electrode, and the bottom electrode.

15. The capacitor of claim 14, wherein the nanocrystal layer has a thickness ranging between 0.5 nm and 10 nm.

16. The capacitor of claim 14, the nanocrystal layer includes germanium having a plurality of polycrystalline grains, wherein the polycrystalline grains have a grain size range between 5 angstrom and 40 angstrom.

17. The capacitor of claim 14, wherein the titanium oxide layer physically contacts the bottom electrode at a first interface that is free of the nanocrystal layer, and
wherein the titanium oxide layer physically contacts the top electrode at a second interface that is free of the nanocrystal layer.

18. The semiconductor structure of claim 1, wherein the dielectric material is titanium oxide and the nanocrystal layer includes germanium,
wherein a first portion of the titanium oxide physically contacts the bottom electrode at a first interface that is free of the nanocrystal layer, and
wherein a second portion of the titanium oxide physically contacts the top electrode at a second interface that is free of the nanocrystal layer.

19. The semiconductor structure of claim 11, wherein the dielectric material is titanium oxide.

20. The semiconductor structure of claim 1, wherein the bottom electrode is longer than the top electrode.

* * * * *